United States Patent [19]

Bergemont et al.

[11] Patent Number: 5,837,574
[45] Date of Patent: Nov. 17, 1998

[54] METHOD OF MANUFACTURING A THIN POLY, CAPACITOR COUPLED CONTACTLESS IMAGER WITH HIGH RESOLUTION AND WIDE DYNAMIC RANGE

[75] Inventors: Albert Bergemont, Palo Alto; Carver A. Mead, Pasadena; Min-hwa Chi, Palo Alto; Hosam Haggag, Santa Clara, all of Calif.

[73] Assignee: National Semiconductor Corporation, Santa Clara, Calif.

[21] Appl. No.: 789,397

[22] Filed: Jan. 29, 1997

Related U.S. Application Data

[62] Division of Ser. No. 438,347, May 10, 1995, abandoned.

[51] Int. Cl.⁶ .................................... H01L 21/8242
[52] U.S. Cl. .................... 438/239; 438/59; 438/202; 148/DIG. 10; 148/DIG. 124; 257/462; 257/444; 257/448
[58] Field of Search .................... 148/DIG. 10; 257/462, 257/444, 448, 443; 438/238, 239, 250, 253, 202, 219, 207, 220, 59

[56] References Cited

U.S. PATENT DOCUMENTS

| | | |
|---|---|---|
| 5,241,169 | 8/1993 | Ohzu . |
| 5,289,023 | 2/1994 | Mead . |
| 5,429,980 | 7/1995 | Yang et al. . |
| 5,501,998 | 3/1996 | Chen . |
| 5,552,619 | 9/1996 | Bergemont et al. . |
| 5,576,237 | 11/1996 | Bergemont et al. ................ 437/50 |

FOREIGN PATENT DOCUMENTS

| | | |
|---|---|---|
| 0 562 523 A1 | 9/1993 | European Pat. Off. . |
| 364015967 A | 1/1989 | Japan . |

OTHER PUBLICATIONS

Eric R. Fossum, "Active–pixel sensors challenge CCDs", Laser Focus World, Technology Guide: Detector Handbook, Jun. 1993, pp. 83–87.

Primary Examiner—John F. Niebling
Assistant Examiner—Long Pham
Attorney, Agent, or Firm—Limbach & Limbach L.L.P.

[57] ABSTRACT

A capacitor coupled contactless imager structure and method of manufacturing the structure results in a phototransistor that includes an N-type collector region formed in P-type semiconductor material. A P-type base region is formed in the collector region. An n-doped polysilicon emitter contact is formed in contact with the surface of the P-type base region such that an n+ epitaxial region is formed in the base region as the emitter of the imager phototransistor. Silicon dioxide separates the polysilicon emitter contact and exposed surfaces of the base region from a layer of poly2 about 500–600 Å thick that is formed to cover the entire base region.

2 Claims, 4 Drawing Sheets

METHOD OF MANUFACTURING A THIN POLY, CAPACITOR COUPLED CONTACTLESS IMAGER WITH HIGH RESOLUTION AND WIDE DYNAMIC RANGE

This is a divisional of application Ser. No. 08/438,347, filed May 10, 1995 of Albert Bergemont, et al. for METHOD OF MANUFACTURING A THIN POLY, CAPACITOR COUPLED CONTACTLESS IMAGER WITH HIGH RESOLUTION AND WIDE DYNAMIC RANGE, now abandoned.

BACKGROUND OF THE INVENTION

1. Field of the Invention

The present invention relates to photosensing elements and, in particular, to a process for manufacturing a contactless imager array that uses a thin polysilicon covering over the entire base region of the phototransistor as the coupling capacitor. This approach results in higher capacitive coupling and smaller pixel cell size than prior art imagers, thereby providing higher resolution and wider dynamic range.

2. Discussion of Related Art

Eric Fossum, "Active-Pixel Sensors Challenge CCDs", Laser Focus World, pp. 83–87, June 1993, discusses emerging active-pixel sensor technology that is poised to replace charge coupled device (CCD) technology in many imaging applications.

As discussed by Fossum, a CCD relies on charge shifting to read out an image. Since it is very difficult to achieve 100% charge transfer efficiency in a CCD structure, performance is sometimes degraded below acceptable levels. In contrast to CCD technology, an active-pixel sensor operates similarly to a random access memory (RAM), wherein each pixel contains its own selection and readout transistors. The signal readout then takes place over conductive wires rather than by shifting charge. Thus, active pixel sensor technology improves on CCD technology by providing random access, nondestructive readout and intergrability with on-chip electronics.

In U.S. Pat. No. 5,289,023, issued Feb. 22, 1994, Carver A. Mead discloses a photosensing pixel element that uses a bipolar phototransistor as both an integrating photosensor and a select device. In Mead's preferred embodiment, the phototransistor is a vertical structure having its collector disposed in a substrate of N-type silicon. The base terminal of the bipolar phototransistor, which comprises a p-doped region disposed within the collector region, is utilized as the select node for the pixel. Conventional field oxide regions are employed to isolate the base regions of adjoining phototransistors. An n-doped polysilicon line is disposed over the surface of the substrate and is insulated therefrom except in regions where it is in contact with the p-doped base regions. Where the n-doped polysilicon is in contact with the surface of the p-type base region, it forms an n+ epitaxial region that serves as the emitter of the phototransistor. The polysilicon line provides the emitter contact.

As further disclosed in the '023 patent, a plurality of the Mead phototransistors may be arranged in an array of rows and columns. The bases of all phototransistors in a row of the array are capacitively coupled together to a common row-select line, and the emitters of all phototransistors in a column are integral with a column sense line. The input of a sense amplifier is connected to the sense line of each column of integrating photosensors. The sense line is connected to the inverting input of an amplifying element of an integrating sense amplifier. A capacitor, preferably a varactor, is also connected between the inverting input and the output of the amplifying element. Exponential feedback is provided in the sense amplifier for signal compression at high light levels. The outputs of the sense amplifiers are connected to sample/hold circuits. The rows of the array are selected one at a time and the outputs of the sample/hold circuits for each row are scanned out of the array while the pixel data for the next row are sampled.

U.S. Pat. No. 5,289,023 is hereby incorporated by reference in its entirety.

In the operation of the pixel imager array disclosed in the '023 patent, the emitter current of the pixel during a read operation is typically in the $\mu A$ range. Therefore, the junction leakage currents set a limit on the dynamic range at low light levels and should be as small as possible. Furthermore, the base coupling capacitor needs to be large compared with the junction capacitance of the emitter, base and collector such that, during the image integration period, the base remains reverse biased with respect to the emitter and collector.

SUMMARY OF THE INVENTION

The present invention provides a capacitor coupled contactless imager structure and a method of manufacturing the structure. The imager structure includes an N-type collector region formed in P-type semiconductor material. A P-type base region is formed in the collector region. An n-doped polysilicon emitter contact is formed in contact with the surface of the P-type base region such that an n+ epitaxial region is formed in the base region as the emitter of the imager structure. Silicon dioxide separates the polysilicon emitter contact and exposed surfaces of the base region from a layer of poly2 about 500–600 Å that is formed to cover the entire base region. The thin poly2 serves as a base coupling capacitor and row conductor for the imager structure. Since the thin poly2 covers the entire base, the image must penetrate through the thin poly2, providing good image sensitivity and efficient base coupling.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

FIGS. 1A–1K provide a sequence of cross-section drawings illustrating a process flow, in accordance with the present invention, for fabricating a capacitor coupled contactless imager structure. The process flow is based upon 0.8 $\mu m$ CMOS technology.

Figure 1A:
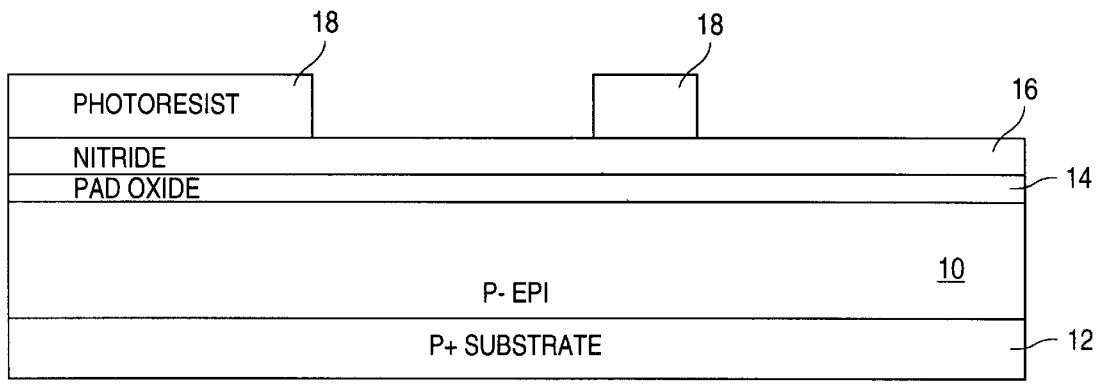
FIGS. 1A–1K provide a sequence of cross-section drawings illustrating a method of fabricating a capacitor coupled contactless imager structure in accordance with the present invention.

Referring to FIG. 1A, the process begins with a standard P-\P+, <100> epi, 24–36 Ωcm, 11 micron wafer; the P-epitaxial silicon 10 formed on a P+ silicon substrate 12 is used for standard CMOS processing. After a conventional ASM global mark bench etch step, a layer of twin well pad oxide 14 about 450 Å thick is grown on the epi layer 10 in a wet oxidation step performed at about 900° C. This is followed by formation of a nitride layer 16 about 1350 Å thick at about 775° C. A twin well photoresist mask 18 is then formed on the nitride layer 16 to define regions of the P– epi layer 10 in which twin N-wells are to be formed.

Figure 1B:
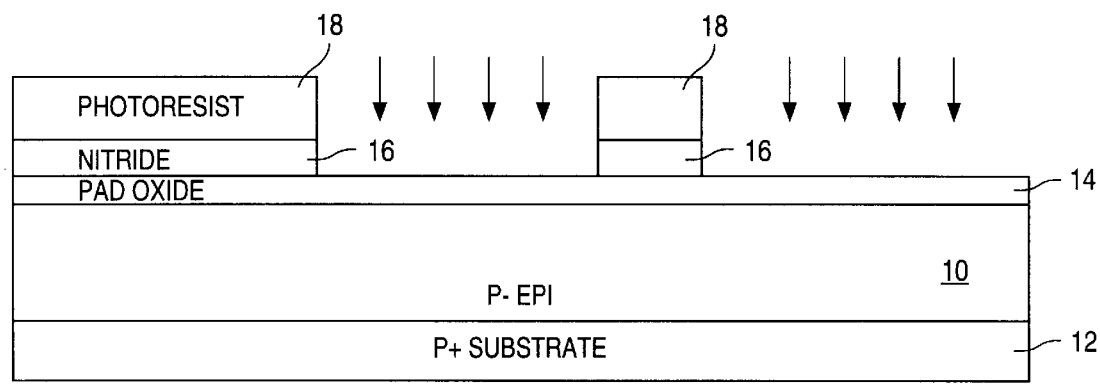

Referring to FIG. 1B, the exposed nitride layer 16 is then etched using, for example, an $SF_6$ etch in Lam 4400 etcher operated at 350 mT and 200 W. Following the nitride etch, phosphorous is implanted into the epi layer 10 at an implant energy of 140 Kev and a dopant concentration of 5.2E12 cm-2. The twin well mask 18 is then stripped.

Figure 1C:
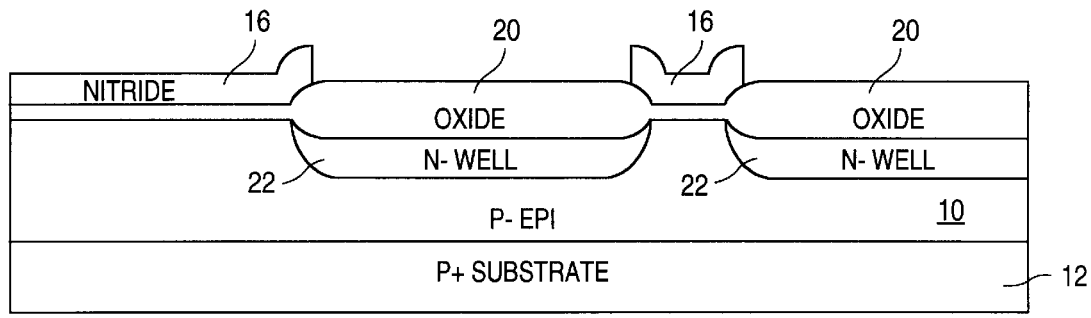

Next, a selective wet oxidation step is performed at about 950° C., resulting in the growth of about 5000–6000 Å of seal oxide 20 over the N-wells 22, as shown in FIG. 1C.

Figure 1D:
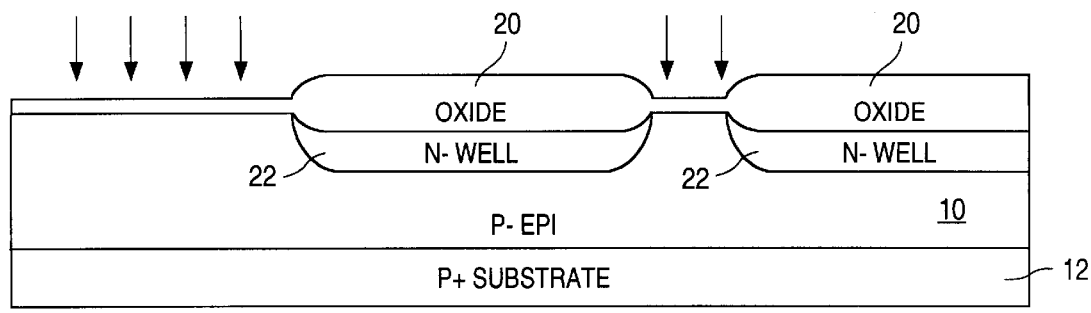
Figure 1E:
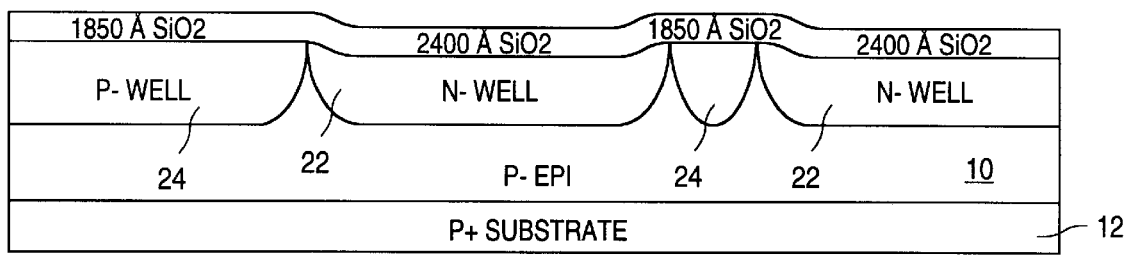

Referring to FIG. 1D, the remaining nitride 16 is then stripped and boron ($BF_2$) is implanted at 150 Kev, 2.7E12 cm-2, to define P-well regions 24. The seal oxide 20 is then etched back to about 1800 Å over the N-wells 22 and a N-well/P-well drive-in step is performed in $O_2$ at about 1100° C. This results in formation of oxide about 2400 Å thick over the N-wells 22 and about 1850 Å thick over the P-wells 24. The resulting structure is shown in FIG. 1E.

Next, the drive-in oxide is stripped and a layer of composite pad oxide 26 about 250 Å is grown in $O_2$ at about 900° C. for about 51 minutes. The pad oxide growth is followed by formation of a layer of composite nitride 28 about 1850 Å thick at 900° C. A photoresist composite mask is then formed to define to-be-formed field oxide (Fox) regions and the composite nitride 28 is etched back using, for example, $SF_6$ in a Lam 4400 etcher at 350 mT and 200 W. The composite mask is then stripped, resulting in the structure shown in FIG. 1F.

Figure 1F:
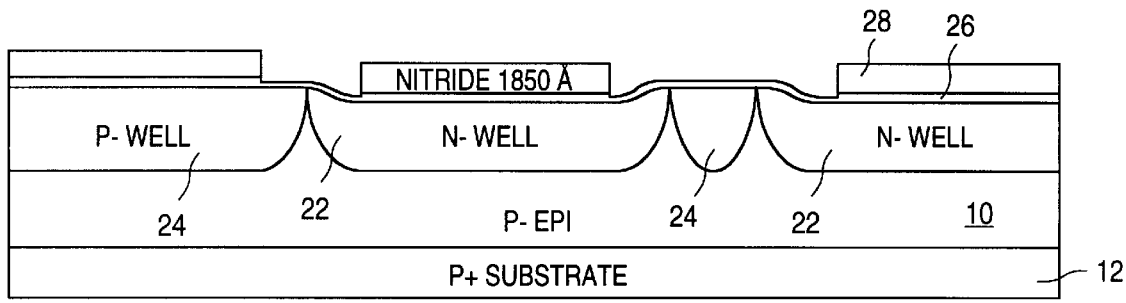
Figure 1G:
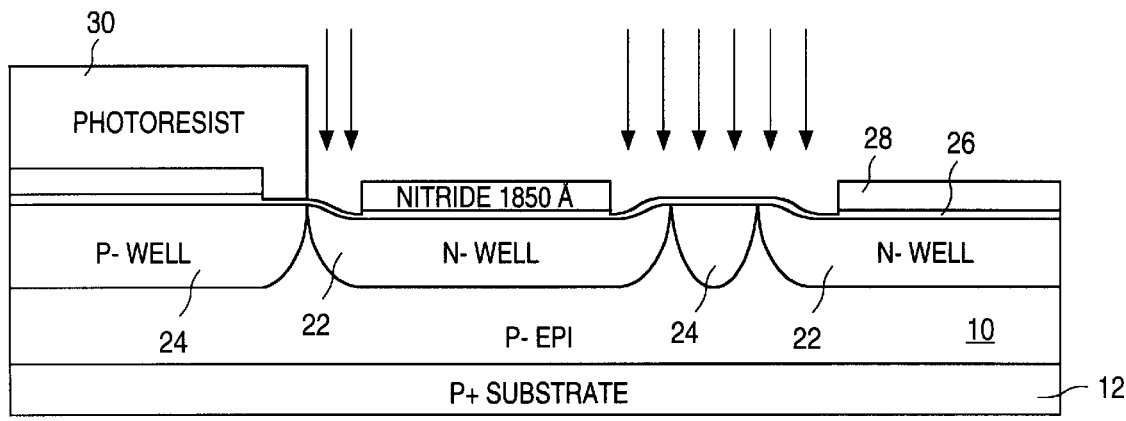
Figure 1H:
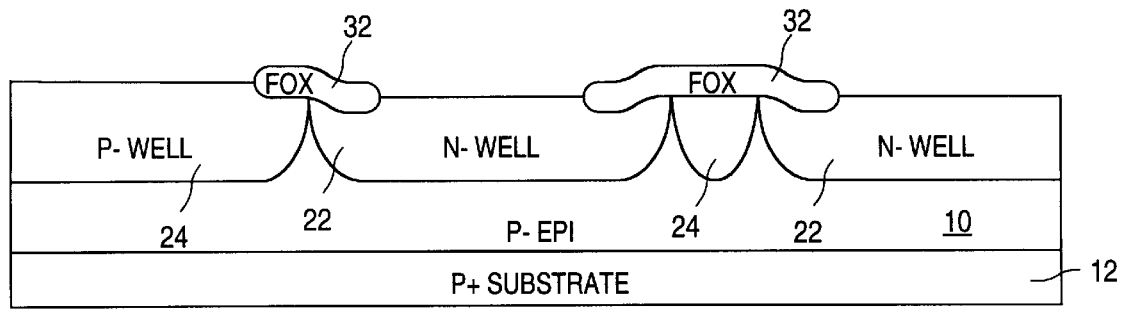
Figure 1I:
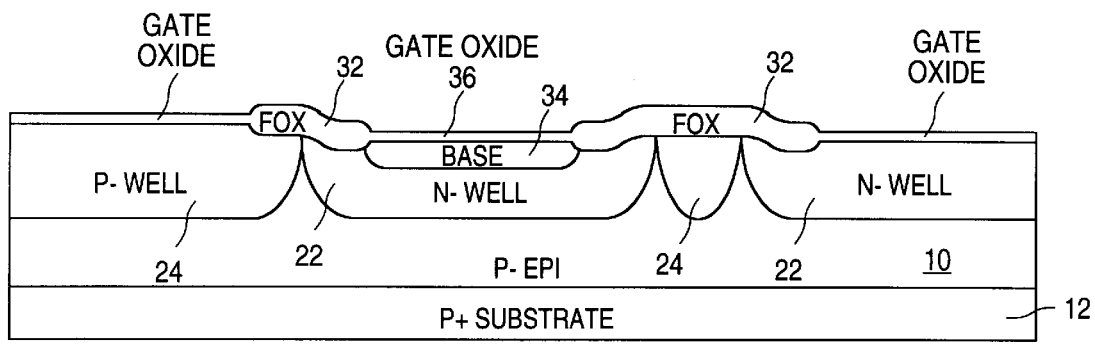

Next, as shown in FIG. 1G, a third photoresist mask (P-field mask) 30 is formed over the FIG. 1F structure and a P+ field implant is performed using boron at 30 Kev, 5.5613 cm-2. Field oxide regions 32 are then grown to a thickness of about 7000 Å in a wet oxidation step performed at 1000° C. for about 140 minutes. The composite nitride 28 and composite pad oxide 26 are then stripped, resulting in the structure shown in FIG. 1H.

A sacrificial oxide layer about 400 Å thick is then grown by wet oxidation at 900° C. for about 8.3 minutes and a threshold $V_T$ implant is performed. The periphery is then masked and boron is implanted into the regions of N-well 22 between the birds beak edges of field oxide regions 32 to define the base 34 of the phototransistor. The periphery protection mask and the sacrificial oxide are then removed and a layer of gate oxide 36 about 150 A thick is grown, resulting in the structure shown in FIG. 1I.

Figure 1J:
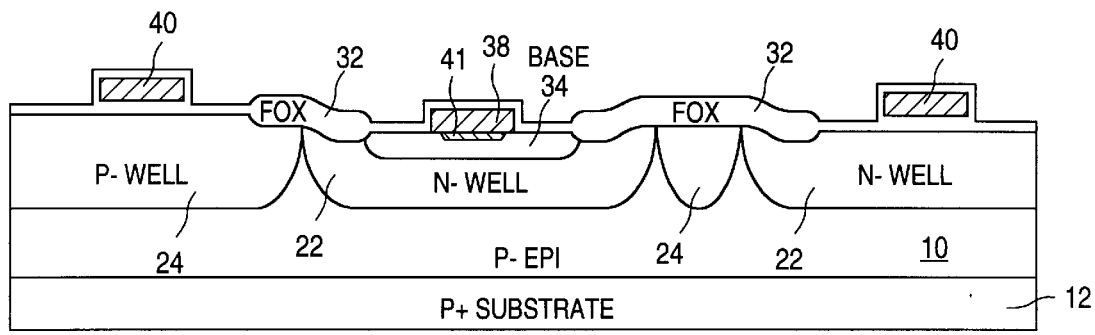
Figure 1K:
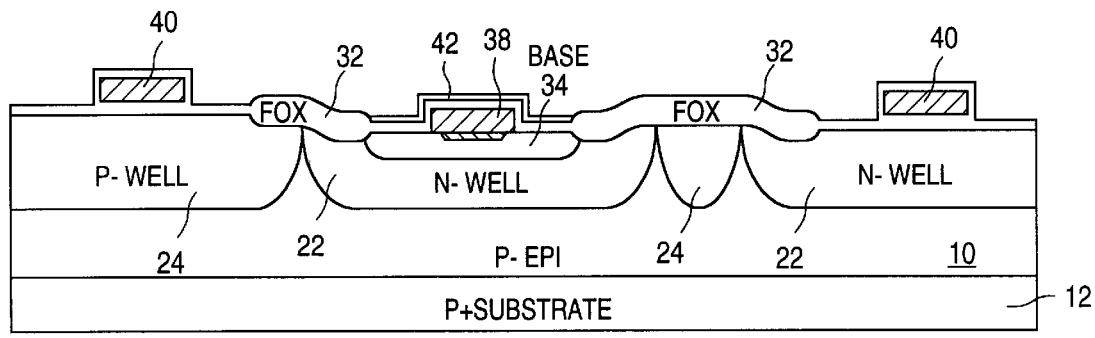

Referring to FIG. 1J, a second peripheral protection mask is then formed which also opens the base area of the phototransistor. The gate oxide 36 is removed from the base area and a first layer of polysilicon about 3250 A thick is deposited and doped to the desired concentration, e.g. Arsenic at 100 Kev, 1.4E16 cm-2. A photoresist mask is then formed to define the polysilicon and the polysilicon is etched, for example using $Cl_2$/He in a Lam 4400 etcher at 425 mT and 275 W, to define the poly1 emitter contact 38 and the gates 40 of the CMOS devices. A differential poly/Si oxide step is then performed in $O_2$ at about 900° C. Where the n-doped polysilicon is in contact with the surface of the p-type base region 34, it forms an n+ epitaxial region 41 which serves as the emitter of the phototransistor. The resulting structure is shown in FIG. 1J.

Next, a base link mask is formed and boron is implanted. The base link mask is then stripped and layer of thin polysilicon about 500–600 Å thick is formed (625° C., 300 mT, 8 min) and doped in-situ. The thin poly2 layer is then masked and etched to define the upper plate 42 of the coupling capacitor. The thin poly mask is then stripped, resulting in the structure shown in FIG. 1K.

The process flow then proceeds with following conventional steps to complete the device structure: Mask LddN, Mask LaaP, Mask N+, Mask P+, Mask Contact, Mask Metal, Mask Pads.

Figure 2:
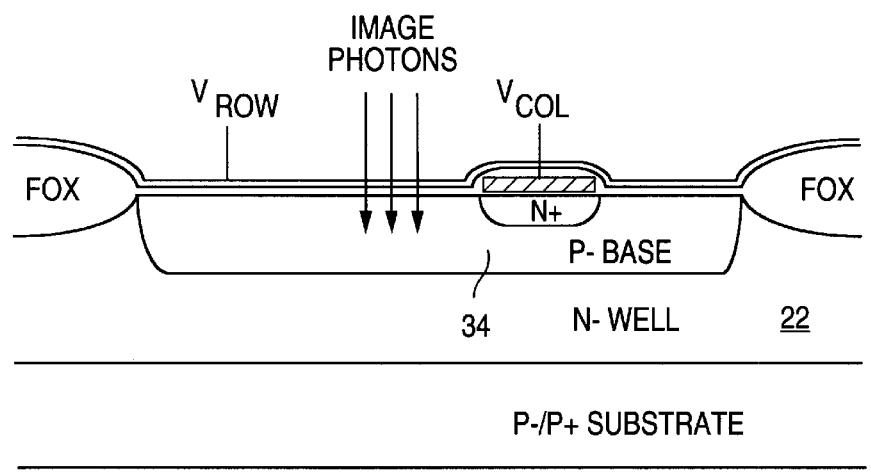
FIG. 2 is a cross-section drawing illustrating a capacitor coupled contactless imager structure fabricated in accordance with the method of the present invention.

FIG. 2 shows the final phototransistor structure. As shown in FIG. 2, the device requires no buried layer, collector epi-layer or back-seal. The poly1 38 serves as the emitter contact and column conductors. The thin poly2 42 serves as the base coupling capacitor and row conductors. In accordance with the invention, the thin poly2 42 (<600 Å) covers the entire base area such that the image must penetrate this layer, providing good image sensitivity and efficient base coupling. (However, the thin poly2 cannot be silicided for RC constant improvement). No metal contact is used in the imager array, leading to small pixel size (about $10u^2$/pixel). The N-well serves as the collector, the P-base is formed by implantation, and all CMOS transistors are fabricated in accordance with a standard CMOS process flow.

Figure 3:
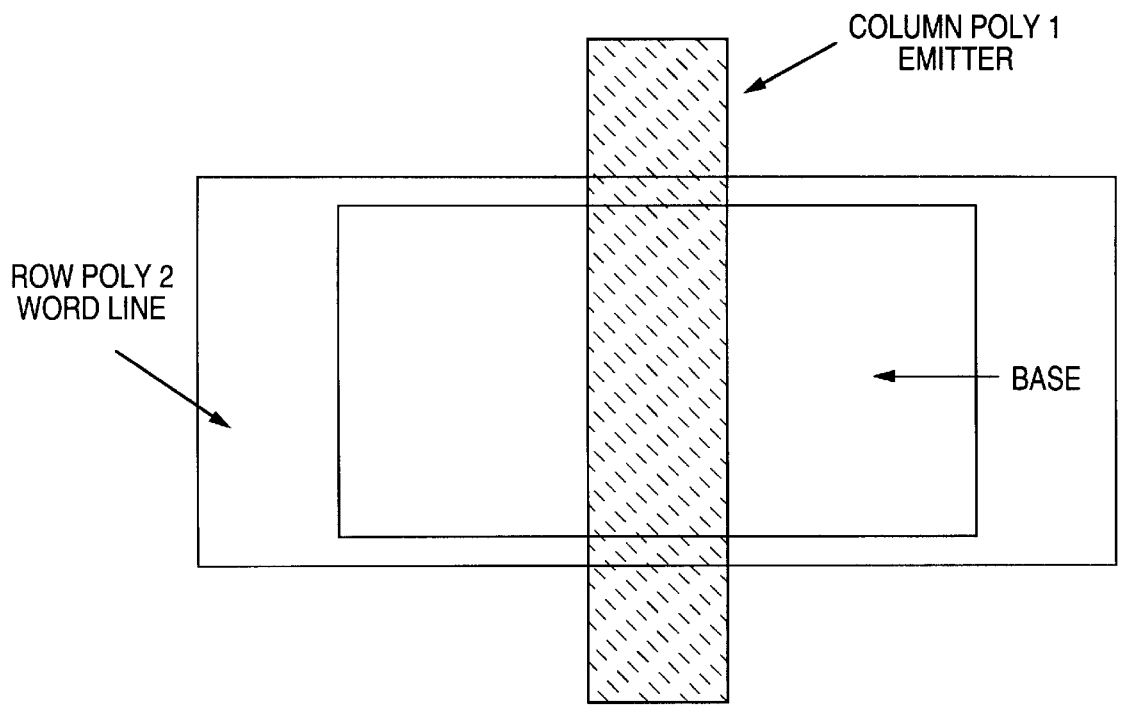
FIG. 3 is a layout illustrating a capacitor coupled contactless imager structure fabricated in accordance with the present invention.

FIG. 3 shows the layout of a contactless pixel phototransistor fabricated in accordance with above-described process. As shown in FIG. 3, the poly2 row (word) line runs over the entire base region. As a consequence, the poly2 must be thin (500–600 Å) to avoid light absorption. Also, in situ doping is required for the thin poly2.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of fabricating a capacitor coupled contactless imager structure in a semiconductor substrate of p-type conductivity while simultaneously fabricating a metal-oxide-semiconductor (MOS) transistor structure in said semiconductor substrate, the method comprising:

(a) forming first and second spaced-apart wells of n-type conductivity (n-wells) in the semiconductor substrate, the first and second n-wells having a region of isolation oxide formed therebetween, the first n-well forming the collector region of the imager structure;

(b) forming a first mask that covers the second n-well;

(c) forming a p-type region in the first n-well, the p-type region forming the base region of the imager structure;

(d) after removing the first mask from the second n-well, forming a layer of gate oxide on the first n-well and on the second n-well;

(e) forming a second mask that covers the second n-well and that covers a peripheral portion of the first n-well while leaving gate oxide formed on a central portion of the first n-well exposed;

(f) removing the exposed gate oxide from the central portion of the first n-well;

(g) after removing the second mask, forming a first polysilicon layer over a structure resulting from foregoing steps (a)–(g) and patterning the first polysilicon layer to form a polysilicon emitter contact region on the central portion of the first n-well and a polysilicon gate electrode on the gate oxide on the second n-well;

(h) forming a silicon dioxide layer over the polysilicon emitter contact region and exposed surfaces of the first n-well and over the polysilicon gate electrode and exposed surfaces of the second n-well;

(i) forming a second polysilicon layer over the structure resulting from foregoing steps (a)–(h) and patterning the second polysilicon layer to provide a polysilicon upper capacitor plate on the silicon dioxide layer over the first n-well, the polysilicon upper capacitor plate covering the entire base region of the imager structure.

2. A method as in claim 1, and wherein the polysilicon upper capacitor plate is about 500°–600° thick.

* * * * *